United States Patent [19]
Rapp

[11] Patent Number: 5,578,954
[45] Date of Patent: Nov. 26, 1996

[54] SELF-TIMING FOUR-PHASE CLOCK GENERATOR

[75] Inventor: A. Karl Rapp, Los Gatos, Calif.

[73] Assignee: National Semiconductor Corporation, Santa Clara, Calif.

[21] Appl. No.: 340,653

[22] Filed: Nov. 16, 1994

Related U.S. Application Data

[63] Continuation-in-part of Ser. No. 70,614, Jun. 2, 1993, Pat. No. 5,398,001.

[51] Int. Cl.$^6$ ................................ H03K 3/04; H03K 5/13
[52] U.S. Cl. ...................... 327/258; 327/295; 327/400; 331/57
[58] Field of Search .............................. 331/57; 327/295, 327/258, 239, 257, 291, 400, 395, 269, 263, 271, 284

[56] References Cited

U.S. PATENT DOCUMENTS

| | | | |
|---|---|---|---|
| 4,554,465 | 11/1985 | Koike | 327/295 |
| 4,617,529 | 10/1986 | Suzuki | 331/57 |
| 4,794,275 | 12/1988 | Traa | 327/295 |
| 4,853,654 | 8/1989 | Sakurai | 331/57 |
| 4,910,471 | 3/1990 | Brahmbhatt et al. | 331/57 |
| 5,068,628 | 11/1991 | Ghoshal | 331/57 |
| 5,081,428 | 1/1992 | Atriss et al. | 331/57 |
| 5,130,566 | 7/1992 | Nguyen | 327/141 |
| 5,302,920 | 4/1994 | Biting | 331/57 |

OTHER PUBLICATIONS

Kuriyama, et al, "A 5V–Only 0.6 μm Flash EEPROM With Row Decoder Scheme in Triple–Well Structure," 1992 IEEE International Solid–State Circuits Conference, pp. 152–153.

*Primary Examiner*—Toan Tran
*Attorney, Agent, or Firm*—Limbach & Limbach L.L.P.

[57] ABSTRACT

A four phase clock generator, which can be employed to operate a charge pump, is configured using coupling elements that ensure that the four phases are non-overlapping. Each of the circuits used to generate one of the four phases of the clock signal consists of a logic block, a buffer block whose delay can be controlled, and a cascade of inverters for amplifying the signal produced by the circuit. The buffer block acts both to invert the signal produced by the logic block, and to delay the signal output by the logic block by an amount which can be varied based on control signals which mirror a current source. The amount of signal delay produced by the buffer is used to adjust the relative timing of the rising and falling edges of each of the four phases of the clock signal (and hence the frequency of the signal) in response to the demand placed upon a charge pump which is driven by the clock signal generator. Two of the clock signal phase circuits have delay elements that have substantial delays that can be used to alter the clock frequency, where the delays can be varied in response to the control signal. The delay introduced by the logic block can also be controlled by the control signal. This provides a clock whose frequency is proportional to the control signal.

7 Claims, 6 Drawing Sheets

SELF-TIMING FOUR-PHASE CLOCK GENERATOR

This application is a continuation-in-part of allowed U.S. patent application Ser. No. 08/070,614, now U.S. Pat. No. 5,398,001, entitled "Self-Timing Four-Phase Clock Generator", filed Jun. 2, 1993 which is assigned to National Semiconductor Corporation of Santa Clara, Calif., the assignee of the present application.

TECHNICAL FIELD

The present invention is directed to charge pumps that are employed to generate higher voltages needed for the operation of electrically erasable programmable read only memory integrated circuit chips, and more specifically, to a four-phase clock signal generator which is suited for driving such charge pumps.

BACKGROUND OF THE INVENTION

Charge pumps are commonly employed as voltage multipliers to generate the higher voltages needed for the operation of electrically erasable programmable read only memory (EEPROM) integrated circuit (IC) chips. The basic EEPROM circuit operates at a relatively low voltage, such as 3 V or 5 V, but some of the circuit functions require a substantially higher voltage such as an internal 15 volts. This higher voltage is typically provided by means of an on chip voltage multiplier which takes the form of a charge pump.

A charge pump is made up of a plurality of stages driven by a plural phase clock. Typically, the clock is operated at a predetermined frequency and is operated continuously so that the highest available value of boosted voltage is present. A voltage regulator is usually then employed to drop the voltage to the desired level. Since the current required from the boosted voltage is typically low, a shunt regulator can be employed.

This means of generating a high voltage on a chip is wasteful because the excess voltage is reduced by a regulated current drain. The result is an inefficient (in terms of the power consumed) means of multiplying the voltage.

What is desired is a plural phase clock generator which can be used to drive a charge pump in a more efficient manner than presently known clock generators used for that purpose.

SUMMARY OF THE INVENTION

The present invention is directed to a four phase clock signal generator suitable for driving a charge pump. The frequency of the clock signal generator is varied by varying an input current. By varying the input current, and hence the frequency of the clock signals, the output voltage of the pump can be efficiently controlled.

The four phase clock circuit is based on CMOS gates which are controlled by limiting currents. As the currents in the gates are increased, the inherent stage delays in the devices are reduced. Each of the clock phase generators includes a delay stage and all four clock phase generators involve voltage transitions that are employed to trigger the transitions of other phases of the clock signal. The basic gate delays operate to provide suitable time intervals between successive edges of the various clock phases. A simple logic circuit is employed to sense the states of the four clock phases and to switch the gates to initiate the desired sequence of clock signal edges and maintain the relationships between the edges described by a set of logical relations which are implemented by the logic circuit. The result is a current responsive control that modulates the clock frequency, and hence the output of the charge pump which is driven by the clock circuit. At zero current the clocks stop (the frequency is zero) and at maximum current the highest clock frequency is produced. Since achievement of a desired high voltage requires a large number of cycles, in the present invention the start up is operated at maximum current and therefore maximum frequency. In the event that no current drain is involved, once the charge pump output is achieved, the clocks can be shut off. When the voltage declines, the clocks are restarted and function to rapidly return the voltage to its desired value, thus regulating the voltage value. If a steady current drain is present the clock will be operated at a frequency that results in a steady value of voltage, thus regulating the voltage against the current drain. Any increase in the current drain results in raising the clock frequency to provide the additional charge.

Further objects and advantages of the present invention will become apparent from the following detailed description and accompanying drawings.

BRIEF DESCRIPTION OF THE DRAWINGS

FIGS. 2(a)–2(e) are graphs showing the timing relationships between the four desired clock phase signals of the clock signal generator of the present invention, and the logic signal (Q) which is used to control the production of the clock signals

DETAILED DESCRIPTION OF THE PREFERRED EMBODIMENT

Figure 1:
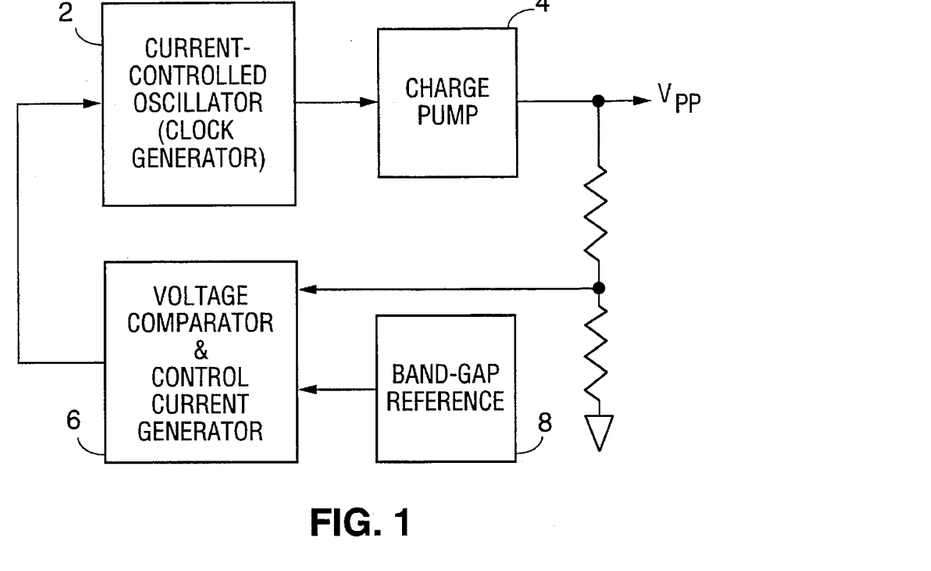
FIG. 1 is a block diagram showing how the clock signal generator circuit of the present invention is used to control the voltage produced by a charge pump.

FIG. 1 is a block diagram showing how the clock signal generator circuit of the present invention 2 is used to control the voltage produced by a charge pump 4. Charge pump 4 is typically used to drive an electrically erasable programmable read only memory (EEPROM) (not shown). A highly efficient charge pump useful for such applications and which employs four clock phases is disclosed in the article entitled, "A 5V-Only 0.6 μm Flash EEPROM With Row Decoder Scheme in Triple-Well Structure", by Kuriyama et al., 1992 IEEE International Solid-State Circuits Conference, pp. 152–53.

As shown in FIG. 1, a fixed fraction of the output of charge pump 4 is used in a feedback control circuit as an input to voltage comparator 6. Reference voltage generator 8 provides a second input to voltage comparator 6. The output of comparator 6 is a signal reflecting the difference between the output of charge pump 4 and that of reference voltage generator 8. This difference signal is used to determine the current produced by a control current generator module contained in comparator 6. The current produced by the control current generator is then used as an input current to clock generator 2, where the magnitude of the current determines the frequency of the clock signals produced by clock generator 2.

FIGS. 2(a)–2(e) are graphs showing the timing relationships between the four desired clock phase signals (A through D) of the clock signal generator 2 of the present invention, and the logic signal (Q) which is used to control the production of the clock signals. As indicated in FIGS. 2(a)–2(e), there exists a prescribed relationship between the initiation of an upward or downward transition of a particular clock signal and the states of the remaining clock signals and the control signal (Q). In addition, there are delays required between the rise of the B clock signal and the rise of the control signal, and also between the rise of the D clock signal and the fall of the control signal. Both the desired order of the clock signals and the desired delay between certain of the clock signals and the control signal are implemented by the clock signal generator of the present invention.

Figures 2A, 2E:
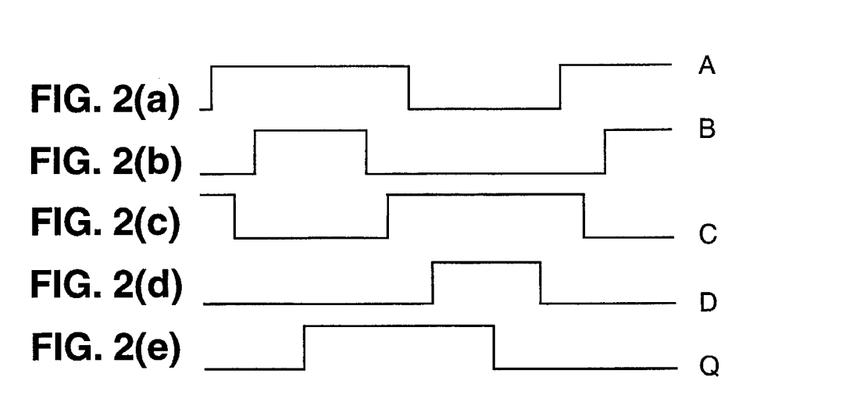
Figure 3:
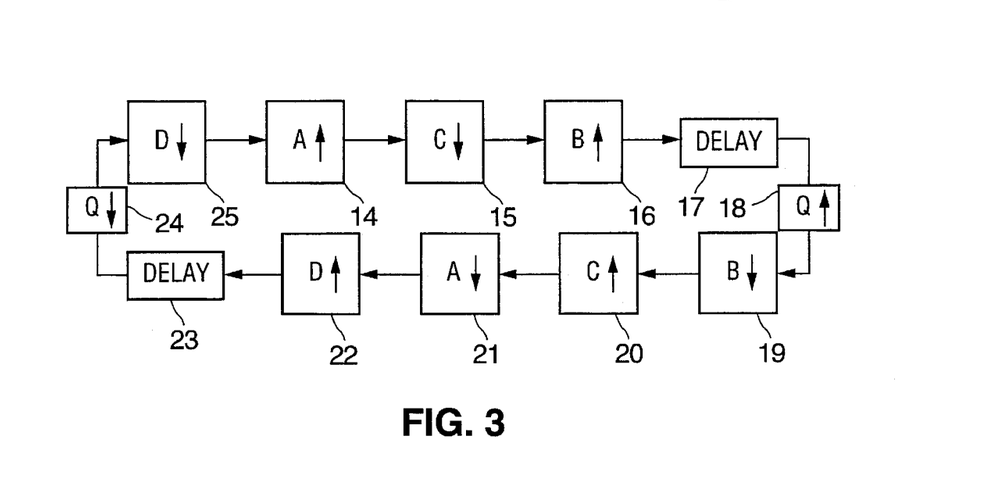
FIG. 3 is a block diagram showing the sequence of transitions in the waveforms of the clock signals and logic signal of FIGS. 2(a)–2(e).

FIG. 3 is a block diagram showing the sequence of transitions in the waveforms of the clock signals shown in FIG. 2(a)–2(e). As shown in the figure, the rising transition at 14 represents the first clock A transition shown in FIG. 2(a). This rise in the clock A signal is used to create the transition at 15, which is the first downward transition of clock C. The downward transition of the clock C signal is used to produce the upward transition at 16 for clock B. The upward transition of clock B is used to create the upward transition of control signal Q, which in turn controls the downward transition of clock B. At 17 a first delay period is introduced prior to the upward transition of control signal Q at 18. The downward transition of clock B at 19 is then used to trigger the upward transition of clock C at 20. This causes the downward transition of clock A at 21. The downward transition of clock A is then used to produce the upward transition at 22 of clock D. The upward transition of clock D is used to control the downward transition of control signal Q, which in turn controls the downward transition of clock D at 25. This completes the cycles of the clocks. A second delay 23 is introduced prior to generating the downward transition at 24 of control signal Q. The downward transition of clock D then becomes the signal which initiates the upward transition of clock A at 14, thereby beginning a new set of clock cycles.

Note that successive transitions of the clocks are of the opposite polarity and are slightly delayed, with the delay being produced by the inherent delay present in a CMOS inverter gate. Typically, this delay is on the order of a few nanoseconds. In the present invention, this delay is modulated by current-mirrored control signals, and acts to determine the frequency of the clock signal produced.

The relationships between the various clock signal transitions shown in FIGS. 2 and 3 can be represented by the set of quasi-logic equations shown below:

A ↑ when D ↓ provided Q is low, and stays high as long as C is low implies $$A=\bar{D}\ \bar{Q}+\bar{C} \quad (1)$$

B ↑ when C ↓ provided Q is low, and B ↓ when Q ↑ implies $$B=\bar{C}\ \bar{Q} \quad (2)$$

C ↑ when B ↓ provided Q is high, and stays high as long as A is low implies $$C=\bar{B}\ Q+\bar{A} \quad (3)$$

D ↑ when A ↓ provided Q is high, and D ↓ when Q ↓ implies $$D=\bar{A}\ Q. \quad (4)$$

In addition, the control signals Q and $\bar{Q}$ are defined by:

$$Q=A\ B2\ \bar{C}\ \bar{D};\text{ and} \quad (5)$$

$$\bar{Q}=C\ D2\ \bar{A}\ \bar{B},\text{ where} \quad (6)$$

B2 and D2 are current-mirror delayed versions of the B clock and D clock signals. The circuits which implement these quasi-logic equations will now be described.

Figure 4:
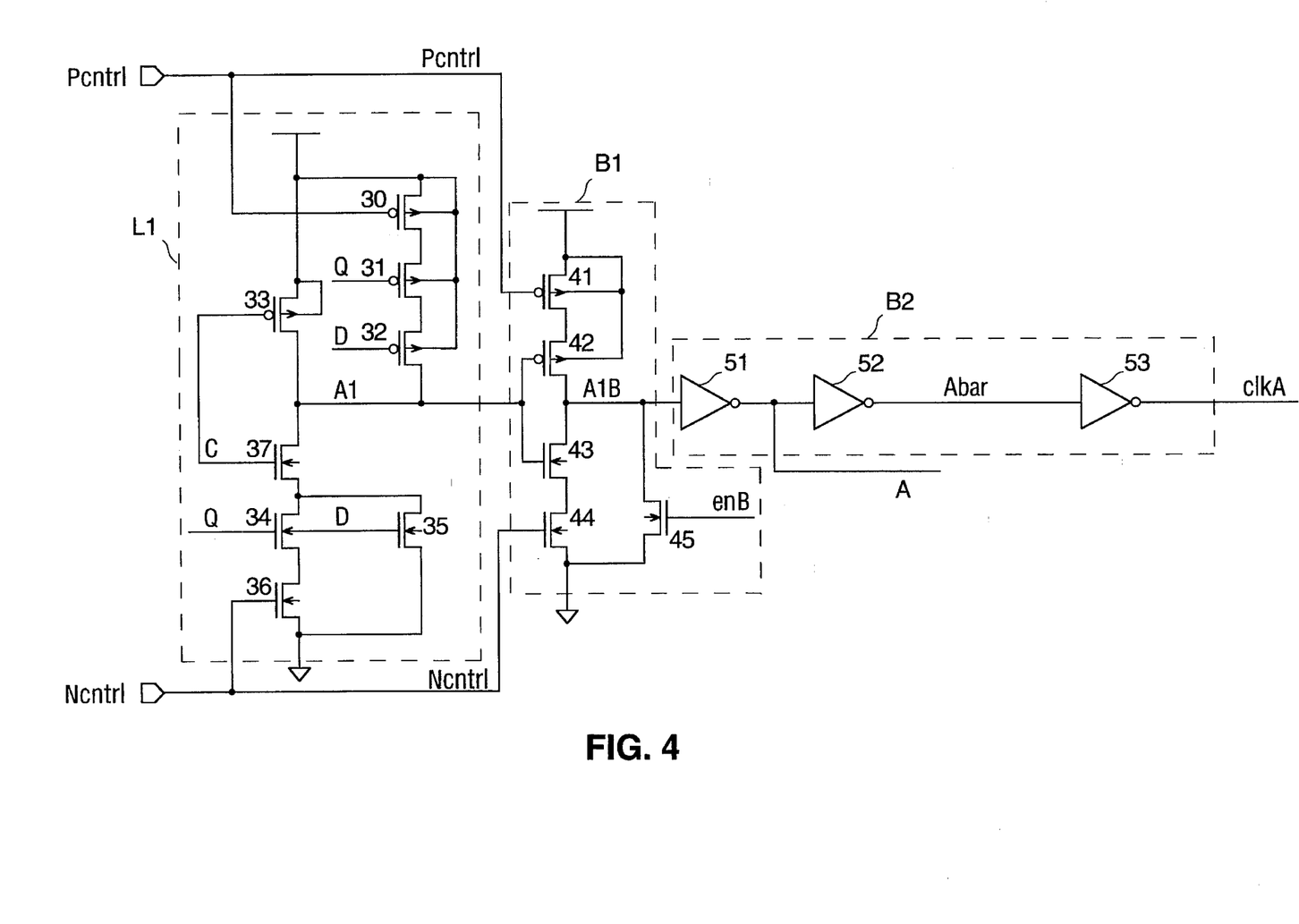
FIG. 4 is a schematic diagram of the circuit that produces clock phase A of FIG. 2(a).

FIG. 4 is a schematic diagram of the circuit that produces clock phase A of FIG. 2(a). The circuit elements contained in the block labeled L1 are responsible for implementing the quasi-logic equation for A shown above. Block L1 has as inputs signals representing D, Q, and C as indicated in the figure. The output of block L1 is a signal A1 which corresponds to the result of equation (1) above.

For example, if the Q signal and the D signal are low, then the series path formed by connecting P-type transistors 31 and 32 conducts and node A1 is pulled up. Similarly, if the C signal is low, parallel P-type transistor 33 conducts, causing node A1 to be pulled up. Thus, transistors 31, 32, and 33 implement quasi-logic equation (1) in P-channel devices.

The dual relationship between P-channel and N-channel devices in conventional CMOS logic means that the reciprocal functions of the P-type devices described above are also represented by a branch of the circuit which uses N-channel devices. For example, whereas transistors 31 and 32 were connected in series in the P-channel branch, transistors 34 and 35 are connected in parallel in the N-channel branch. Transistor 36 is connected in series with transistor 34 and serves the same purpose as transistor 30 in the P-channel branch, i.e., to provide a means of controlling the current in the branches of the circuit. As will be explained in greater detail later, these current limiting transistors respond to control signals and act to adjust the frequency of the clock signals produced by the present invention. Transistor 37 serves to implement the portion of equation (1) which depends upon the C signal in the N-channel branch. The end result is that transistors 30 through 37 implement the logical operations represented by equation (1) in both P-channel and N-channel architectures.

The output of block L1 is the signal A1 which represents the result of equation (1). This signal serves as an input to block B1 which consists of transistors 41 through 45. Block B1 serves as a buffer stage which both inverts the signal A1 to form $\bar{A}1$ and provides a delay in the propagation of the inverted signal to the next stage. Transistors 42 and 43 perform the inversion of the signal, while transistors 41 and 44, which are under the control of P-control and N-control signals determine the amount of delay through the stage. Transistor 45 is used to either enable or disable block B1 (and hence the circuit for producing the clock A signal) by means of a control signal en(able)B. Thus, the enB signal can be used to turn the clock circuit on or off. The enB signal is typically provided by an external controller not shown in the figure.

The final stage in the clock A signal circuit is a second buffer stage, labelled block B2. Block B2 is composed of three inverters, labelled transistors 51, 52, and 53 in the figure. Inverter 51 receives as an input the signal $\overline{A1}$ output by block B1 and produces an output signal A. Similarly, inverter 52 receives as an input the signal A and produces an output signal $\overline{A}$, and inverter 52 receives as an input the signal $\overline{A}$ and produces an output signal A which corresponds to the clock A signal. The three inverters provide a slight delay in the propagation of the signal, but are primarily used to amplify the signal. Each of the three inverters is successively larger, thereby providing a cascade of inverters which acts to amplify the signal and increase the driving capability of the clock A circuit. Note that unlike blocks L1 and B1, block B2 is not under the control of the P-control and N-control signals.

The P-control and N-control signals mentioned previously are used to control the amount of current conducted by transistors 30 and 36 in block L1, and transistors 41 and 44 in block B1. The P-control and N-control signals are derived from an external current source contained in voltage comparator 6 of FIG. 1, which also contains a transistor which forms a current mirror pair with either transistor 30 or transistor 36 in block L1, or transistor 41 or transistor 44 in block B1. The magnitude of the mirrored current determines the rate at which the output of the current controlled blocks can change, thereby determining the amount of delay through those stages. Thus, as the current produced by the control current generator contained in voltage comparator 6 of FIG. 1 changes, the amount of delay through blocks L1 and B1 of the clock A circuit shown in FIG. 4 is altered. The result is that the frequency of the signal produced by the clock A circuit can be varied based on varying the current produced by voltage comparator 6. Since the current produced is a function of output voltage 10 of charge pump 4, the frequency of clock A can be changed (and the delay between a clock A transition and the initiation of a subsequent transition in another clock) by using the P-control and N-control signals until the output voltage is sufficiently close to a desired reference voltage. This permits a high voltage to be maintained by means of the feedback circuitry shown in FIG. 1.

Figure 5:
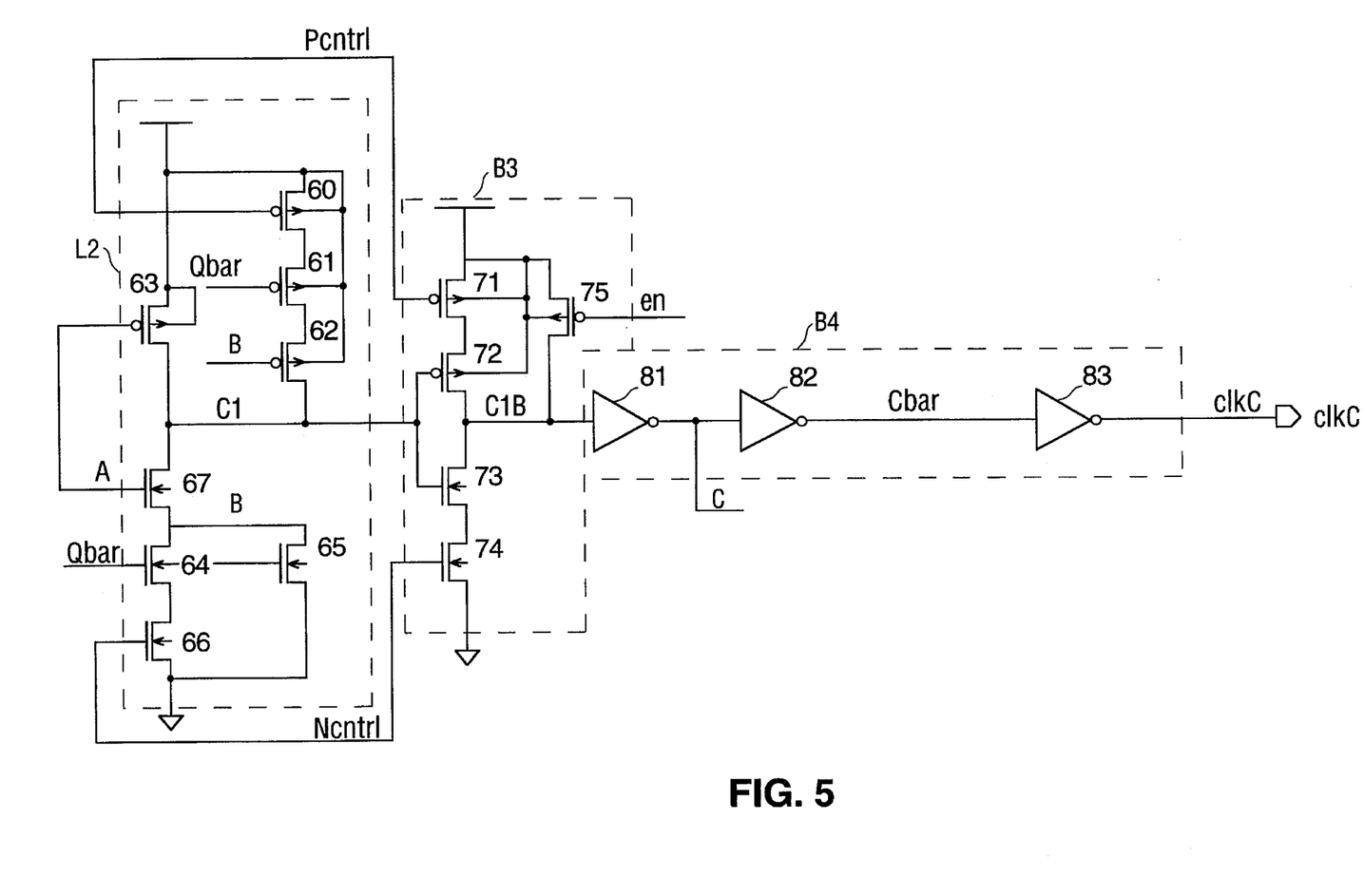
FIG. 5 is a schematic diagram of the circuit that produces clock phase C of FIG. 2(c).

FIG. 5 is a schematic diagram of the circuit that produces clock phase C of FIG. 2(c). The circuitry for producing the clock C signal is substantially the same as that for producing the clock A signal, shown in FIG. 4. The circuit elements contained in the block labeled L2 are responsible for implementing the quasi-logic equation (3) for C shown above. Block L2 has as inputs signals representing B, $\overline{Q}$, and A as indicated in the figure. The output of block L2 is a signal C1 which corresponds to the result of equation (3) above.

As discussed with reference to FIG. 4, transistors 61 and 62 are connected in series and connected in parallel to transistor 63 to implement the P-type branch of the logic relations expressed in equation (3). Transistors 64 and 65 are connected together in parallel and in series with transistor 67 to implement the corresponding N-type branch of equation (3). Transistors 60 and 66 again serve as current limiting transistors which are controlled by the appropriate P-control or N-control signals described previously.

The output of block L2 is the signal C1 which represents the result of equation (3). This signal serves as an input to block B3 which consists of transistors 71 through 75. Block B3 serves as a buffer stage which both inverts the signal C1 to form $\overline{C1}$ and provides a delay in the propagation of the inverted signal to the next stage. Transistors 72 and 73 perform the inversion of the signal, while transistors 71 and 74, which are under the control of P-control and N-control signals determine the amount of delay through the stage. As before, transistor 75 is used to either enable or disable block B3 (and hence the circuit for producing the clock C signal) by means of a control signal, in this case en(able), the complement of en(able)B.

The final stage in the clock C signal circuit is a second buffer stage, labelled block B4. Block B4 is composed of three inverters, labelled transistors 81, 81, and 83 in the figure. Inverters 81, 81, and 83 perform the same operations on the $\overline{C1}$ signal as the inverters described with reference to FIG. 4. The three inverters again provide a slight delay in the propagation of the signal, but are primarily used to amplify the signal. Each of the three inverters is successively larger, thereby providing a cascade of inverters which acts to amplify the signal and increase the driving capability of the clock C circuit.

Figure 6:
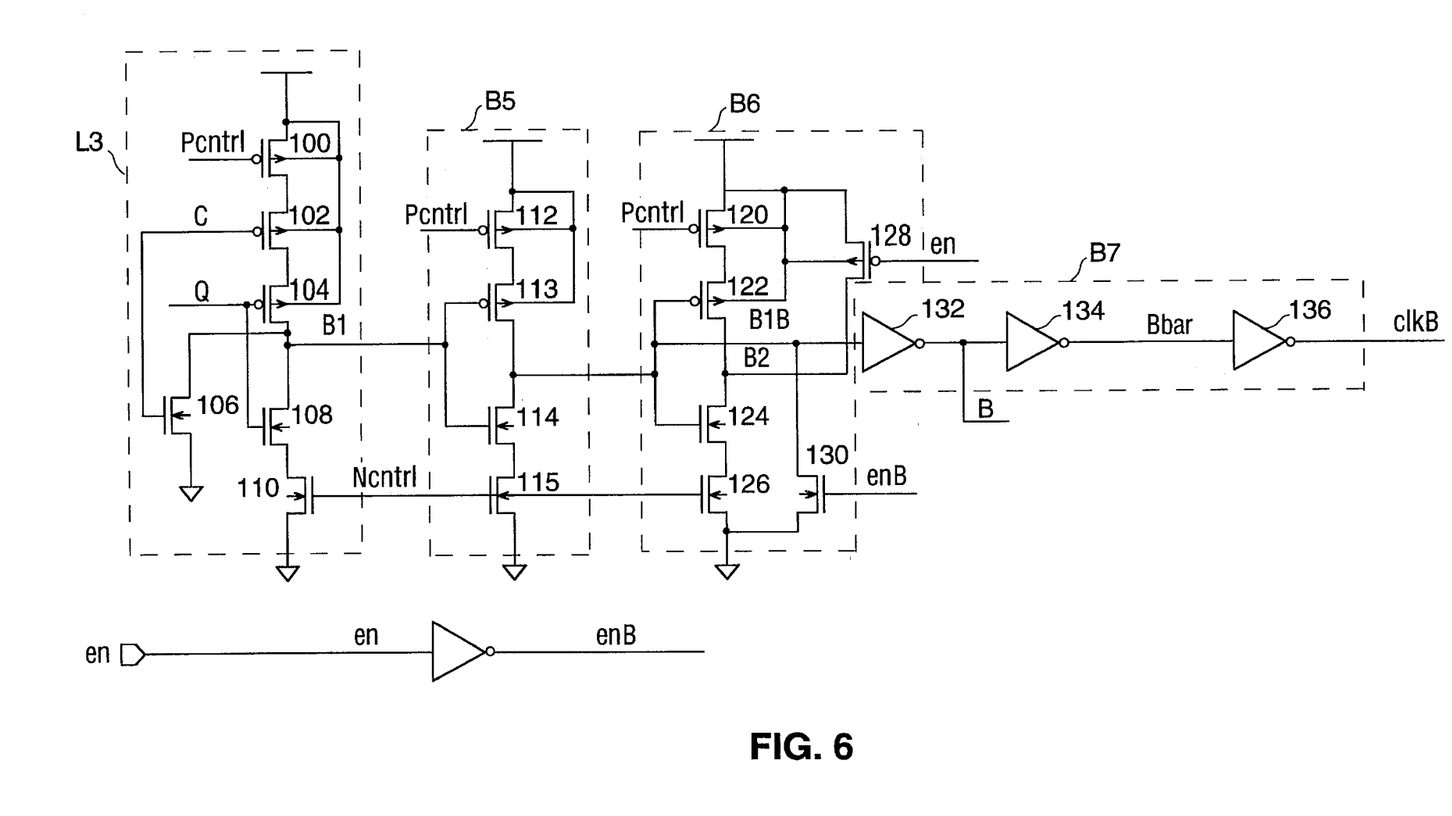
FIG. 6 is a schematic diagram of the circuit that produces clock phase B of FIG. 2(b).

FIG. 6 is a schematic diagram of the circuit that produces clock phase B of FIG. 2(b). The circuit elements contained in the block labeled L3 are responsible for implementing the quasi-logic equation for C shown above. Block L3 has as inputs signals representing Q and C as indicated in the figure. The output of block L3 is a signal B1 which corresponds to the result of equation (2) above.

For example, if $\overline{C}$ is true then C is low, and if $\overline{Q}$ is true then Q is low. This combination of states turn on series connected P-type transistors 102 and 104, thereby providing a path to pull up node B1. As discussed previously, parallel connected N-type transistors 106 and 108 form the N-channel branch which corresponds to the same quasi-logic equation as implemented by transistors 102 and 104. Transistor 100 is connected in series with the P-channel logic branch and serves the current limiting function described previously under the control of a P-control signal. Transistor 110 serves a similar function in the N-channel branch of block L3 and is under the control of an N-control signal.

The output of block L3 is the signal B1 which represents the result of equation (2). This signal serves as an input to block B5 which consists of transistors 112 through 115. Block B5 serves as a buffer stage which both inverts the signal B1 to form $\overline{B1}$ and provides a delay in the propagation of the inverted signal to the next stage. Transistors 113 and 114 perform the inversion of the signal, while transistors 112 and 115, which are under the control of P-control and N-control signals determine the amount of delay through the stage.

Unlike the circuits described with reference to FIGS. 4 and 5, the clock B circuit contains an additional stage prior to the final set of inverters. The purpose of this stage, labelled B6 in FIG. 6, can be understood by reference to FIGS. 2 and 3. As indicated in FIG. 2(b), after the edge of the clock B signal rises, there is some delay before the control signal Q rises. This is also apparent from equations (1), (2), and (5) which show how a change in the state of Q determines when the edge of the clock B signal falls. To achieve this purpose of providing a delay between the time at which the clock B signal rises and the Q control signal rises, the clock B circuit shown in FIG. 6 has two signal paths input from block B5 to block B6. A first path, labelled B1B (for $\overline{B1}$) connects the output of block B5 and the input of block B7, which is the set of cascaded inverters described with reference to FIGS. 4–5. The second path serves as an input to block B6, which acts to invert it and delay it by a controllable amount to form signal B2. This signal (B2) serves as one of the inputs to the logic gates which control the timing of the change in states for the Q and $\overline{Q}$ signals, the operation of which will be described later.

Block B6 is composed of transistors 112 and 114 which form an inverter and act to invert the input signal $\overline{B1}$ from block B5 to form the signal B2. Transistors 120 and 126 are current limiting transistors as described previously with reference to the P-control and N-control stages of other blocks of the clock generator circuitry. These transistors allow control of the amount of delay introduced by the action of block B6 on the input $\overline{B1}$. Transistors 128 and 130 are used to either enable or disable block B6 (and hence the circuit for producing the clock B signal) by means of control signals en(able) and en(able)B.

The undelayed signal, $\overline{B1}$, serves as an input to block B7 which is a set of cascaded inverters composed of transistors 132, 134, and 136. As discussed previously, the three inverters provide a slight delay in the propagation of the signal, but are primarily used to amplify the signal. Each of the three inverters is successively larger, thereby providing a cascade of inverters which acts to amplify the signal and increase the driving capability of the clock B circuit. The final outputs of the clock B circuit shown in FIG. 6 are the clock B signal and the delayed signal B2, where as has been explained, the amount of delay can be adjusted by the P-control and N-control signals input to block B6.

Figure 7:
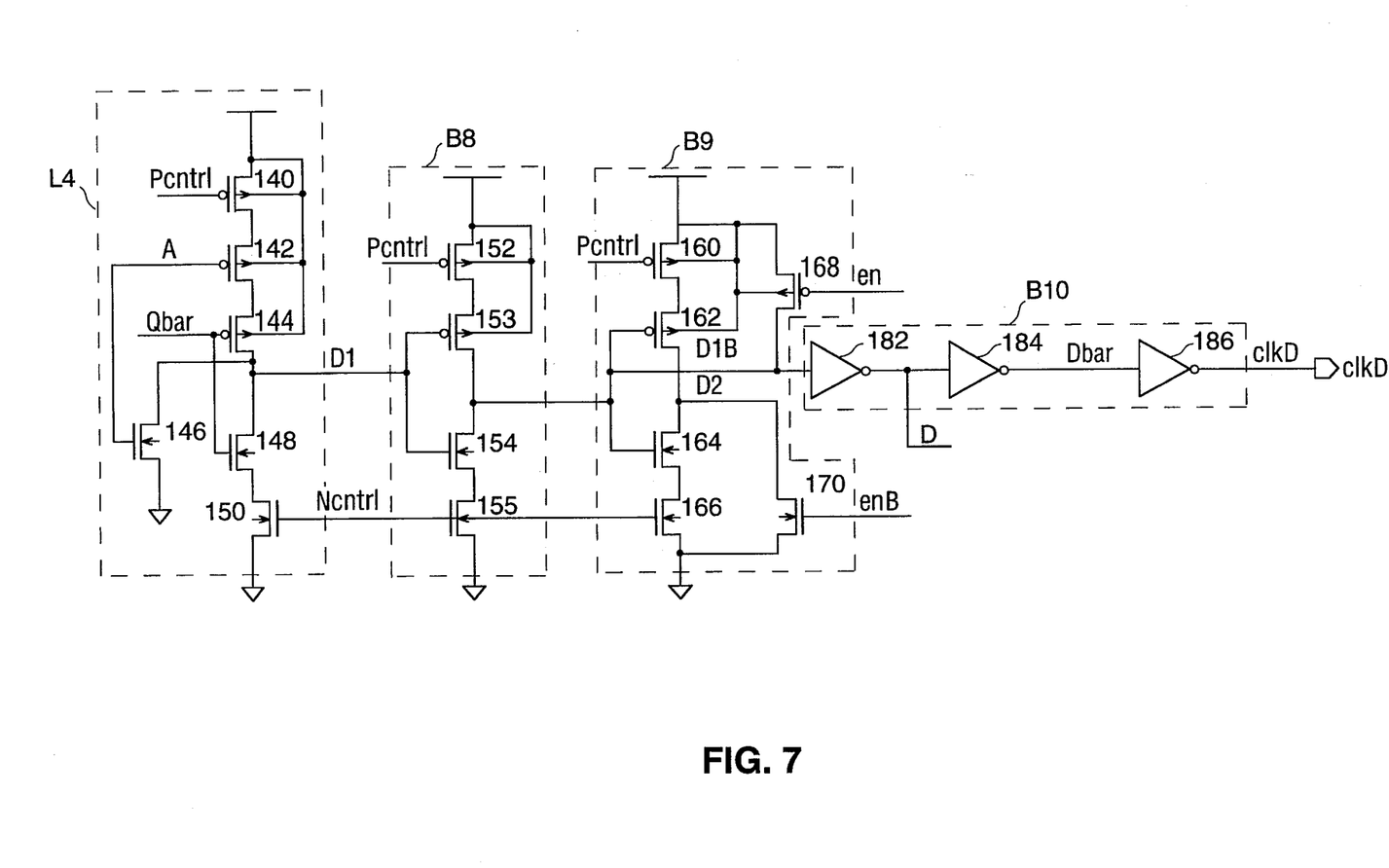
FIG. 7 is a schematic diagram of the circuit that produces clock phase D of FIG. 2(d).

FIG. 7 is a schematic diagram of the circuit that produces clock phase D of FIG. 2(d). The circuitry for producing the clock D signal is substantially the same as that for producing the clock B signal, shown in FIG. 6. The circuit elements contained in the block labeled L4 are responsible for implementing the quasi-logic equation (4) for D shown above. Block L4 has as inputs signals representing A and $\overline{Q}$ as indicated in the figure. The output of block L4 is a signal D1 which corresponds to the result of equation (4) above.

As discussed with reference to FIG. 6, transistors 142 and 144 are connected in series with each other and connected in series to transistor 140 to implement the P-type branch of the logic relations expressed in equation (4). Transistors 146 and 148 are connected together in parallel and in series with transistor 150 to implement the corresponding N-type branch of equation (4). Transistors 140 and 150 again serve as current limiting transistors which are controlled by the appropriate P-control or N-control signals described previously.

The output of block L4 is the signal D1 which represents the result of equation (4). This signal serves as an input to block B8 which consists of transistors 152 through 155. Block B8 serves as a buffer stage which both inverts the signal D1 to form $\overline{D1}$ and provides a delay in the propagation of the inverted signal to the next stage. Transistors 153 and 154 perform the inversion of the signal, while transistors 152 and 155, which are under the control of P-control and N-control signals determine the amount of delay through the stage.

As mentioned when discussing the clock B circuit of FIG. 6, the clock D circuit contains an additional stage prior to the final set of inverters. The purpose of this stage is similar to that of the same stage in the clock B circuit, i.e., to provide a delay of the clock D signal so that the fall in the clock D signal can be coordinated with the fall of the Q control signal.

To achieve this purpose of providing a delay between the time at which the clock D signal falls and the Q control signal falls, the clock D circuit shown in FIG. 7 has two signal paths input from block B8 to block B9. A first path, labelled D1B connects the output of block B8 and the input of block B9, which is a set of cascaded inverters such as those previously described with reference to the other figures. The second path serves as an input to block B9, which acts to invert it and delay it by a controllable amount to form signal D2. This signal (D2) serves as one of the inputs to the logic gates which control the timing of the change in states for the Q and $\overline{Q}$ signals.

Block B9 is composed of transistors 162 and 164 which form an inverter and act to invert the input signal $\overline{D1}$ from block B8 to form the signal D2. Transistors 160 and 166 are current limiting transistors as described previously with reference to the P-control and N-control stages of other blocks of the clock generator circuitry. These transistors allow control of the amount of delay introduced by the action of block B9 on the input $\overline{D1}$. Transistors 168 and 170 are used to either enable or disable block B8 (and hence the circuit for producing the clock D signal) by means of control signals en(able) and en(able)B.

The undelayed signal, $\overline{D1}$, serves as an input to block B10 which is a set of cascaded inverters composed of transistors 182, 184, and 186. As discussed previously, the three inverters provide a slight delay in the propagation of the signal, but are primarily used to amplify the signal. Each of the three inverters is successively larger, thereby providing a cascade of inverters which acts to amplify the signal and increase the driving capability of the clock D circuit. The final outputs of the clock D circuit shown in FIG. 7 are the clock D signal and the delayed signal D2, where as has been explained, the amount of delay can be adjusted by the P-control and N-control signals input to blocks B8 and B9.

Figure 8:
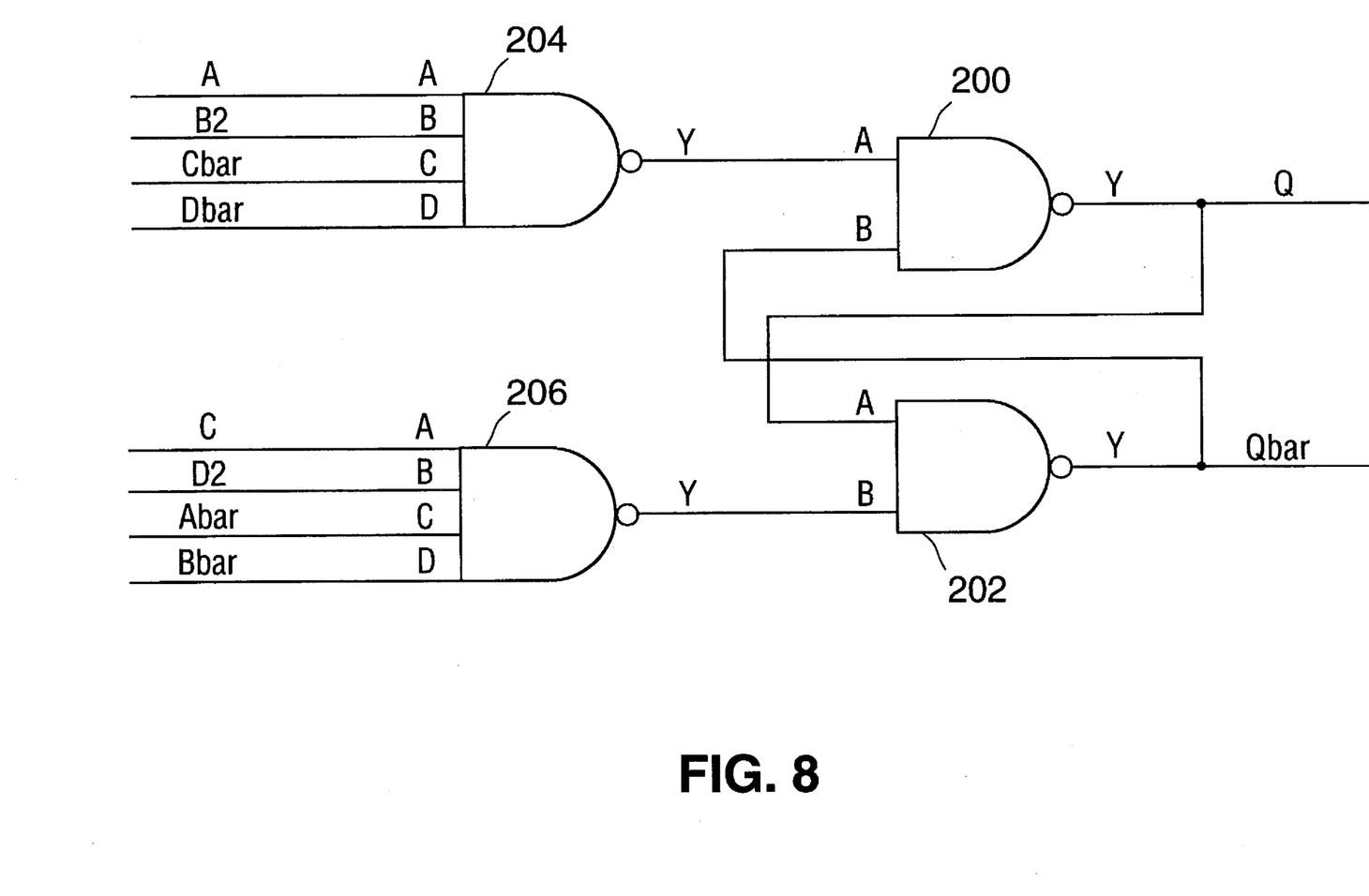
FIG. 8 is a block diagram of a logic circuit that controls the operation of the clock circuits of FIGS. 3–6.

FIG. 8 is a block diagram of the logic circuit that is associated with the circuits of FIGS. 3–6. As shown in FIG. 8, the present invention includes NAND gate circuits which have as inputs the signals A, B2, $\overline{C}$, and $\overline{D}$ in one branch, and C, D2, $\overline{A}$, and $\overline{B}$ in a second branch. The output of the 4 NAND gate circuit are the signals Q and $\overline{Q}$, which as noted previously are used as inputs to some of the stages of the clock generator circuitry. Two input NAND gates 200 and 202 form a latch. Four input NAND gate 204 provides the latch set pulse and four input NAND gate 206 provides the reset pulse. The Q control signal becomes set when A and B2 both are high, reset when C and D2 both are high. The additional control inputs to the circuit are added to prevent any unwanted logic state that could lock up the free-running clock oscillator. The $\overline{Q}$ output drives transistors 31 and 34 of FIG. 4 and transistor 104 of FIG. 6, while the $\overline{Q}$ output drives transistors 61 and 64 of FIG. 5 and transistor 144 of FIG. 7.

As has been described, the present invention is directed to an apparatus for generating a four phase clock signal for use in driving a charge pump. The clock signal generator is composed of four circuits, one for generating each phase of the four phase signal, and a logic circuit block which generates a control signal used to initiate certain features of the phases of the clock signal.

Each of the circuits used to generate one of the four phases of the clock signal consists of a logic block, a buffer block whose delay can be controlled, and a cascade of inverters for amplifying the signal produced by the circuit. The logic block implements a quasi-logic equation which describes the required relationships between the control signal (Q) and the rising or falling edges of other phases of the clock signal. The buffer block acts both to invert the signal produced by the logic block, and more importantly to delay the signal output by the logic block by an amount which can be varied based on control signals which mirror a current source. The logic block also contains transistors whose operation (the amount of current which it can conduct) can be controlled by a control signal. The mount of signal delay produced by the buffer is used to adjust the relative timing of the rising and falling edges of each of the four phases of the clock signal (and hence the frequency of the signal) in response to the demand placed upon a charge pump which is driven by the clock signal generator. The cascade of inverters supplies a minimal delay to the signal and acts to amplify the final signal so that it is capable of driving the charge pump or other device to which the clock signal generator is connected.

The control signals which control the amount of current transistors in the logic block and buffer block can conduct reflect the amount of current being mirrored from a current source external to the clock signal generator. By having both the logic and buffer stages controlled by such control signals, a unified response to changes in the current source is obtained. This response determines the delay provided by those stages and hence the ultimate frequency of the clock signal produced by the apparatus.

The separate logic circuit which generates the control signal Q or $\bar{Q}$ is used to adjust the timing between the rise or fall of the B and D phase clock circuits and the control signals. This has the effect of determining the width of the B and D signals and insures that all transitions are under the control of the logical relationships implemented by the circuit.

The quasi-logic equations which define the operation of the logic blocks in each of the four clock circuits fully implement the relationships between the edges of each of the four phases of the clock signal. This prevents "floating" nodes which might be susceptible to noise coupling, thereby degrading the quality of the clock signal produced by the present invention. In addition, by having the delay portion of the clock B and clock D circuits under the control of the Q logic relationships (as opposed to a delay block contained within the clock B or clock D circuits), the frequency of the clock signal produced by the clock signal generator is more controllable. This is a result of the time between edges of the four phases of the clock signal being more accurately and uniformly controlled.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. As an example, while the circuits described in this application are composed of conventional CMOS elements, the various functions could be implemented in other equivalent designs.

I claim:

1. A four phase clock signal generator comprising:

first clock means for generating an upward signal transition in a first phase of the clock signal;

second clock means responsive to said upward transition in said first phase for generating a downward signal transition in a third phase of the clock signal;

third clock means responsive to said downward transition in said third phase for generating an upward signal transition in a second phase of the clock signal;

clock signal phase recognition means for storing a state of the phases of the clock signal, wherein when the first phase of the clock signal is high, the third phase of the clock signal is low, a fourth phase of the clock signal is low, and the second phase of the clock signal transitions high, the first clock signal phase recognition means produces a downward signal transition of said second phase of the clock signal;

fourth clock means responsive to said downward transition of said second phase for generating an upward signal transition of said third phase of the clock signal;

fifth clock means responsive to said upward transition of said third phase for generating a downward signal transition of said first phase of the clock signal;

sixth clock means responsive to said downward transition of said first phase for producing an upward signal transition of the fourth phase of the clock signal;

second clock signal phase recognition means for storing a state of the phases of the clock signal, wherein when the first phase of the clock signal is low, the second phase of the clock signal is low, the third phase of the clock signal is high, and the fourth phase of the clock signal transitions high, the second clock signal phase recognition means produces a downward signal transition of said fourth phase of the clock signal; and said first clock means responsive to said downward transition of said fourth phase to produce said upward signal transition of said first phase of the clock signal, whereby said clock generator starts a new clock cycle.

2. The four phase clock generator of claim 1, wherein each of said first through sixth clock means comprise inverter gates, whereby said transitions in said four phases are delayed.

3. The four phase clock generator of claim 2, wherein the inverter gates are CMOS devices.

4. An apparatus for generating a four phase clock signal, comprising:

first means having an input and an output for generating a first one of the four phases of the clock signal at the output of the first means;

second means having an input and an output for generating a second one of the four phases of the clock signal at the output of the second means;

third means having an input and an output for generating a third one of the four phases of the clock signal at the output of the third means;

fourth means having an input and an output for generating a fourth one of the four phases of the clock signal at the output of the fourth means, wherein each of said first through fourth means comprise:

logic means for generating the respective one of the four phases dependent on a state of at lest one of the other three phases of the clock signal and a state of a control latch in a prescribed manner, wherein the state of the control latch is dependent on the states of the four phases of the clock signal; and means for amplifying the respective phase signal from the logic means.

5. The four phase clock signal generating apparatus of claim 4, each of said first through fourth means further comprising:

means coupled to the logic means and the amplifying means for uniformly varying a delay between the rising and falling edges of the phase clock signal of the respective first through fourth means in response to a control signal.

6. The four phase clock signal generating apparatus of claim 4, wherein the logic means implements the predefined relationships:

$A = \bar{D} \; \bar{Q} + \bar{C}$ $B = \bar{C} \; \bar{Q}$ $C = \bar{B} \; Q + \bar{A}$ $D = \bar{A} \; Q$ $Q = A \; B2 \; \bar{C} \; \bar{D}$ $\overline{Q} = C\, D2\, \overline{A}\, \overline{B}$ where A, B, C, and D are the rising edges of the first through fourth clock phases, respectively, Q is an output of the control latch, and B2 and D2 are delayed versions of B and D, respectively.

7. The four phase clock signal generating apparatus of claim 4, wherein the logic means and amplifying means in the first through fourth means are CMOS devices.

* * * * *

UNITED STATES PATENT AND TRADEMARK OFFICE
CERTIFICATE OF CORRECTION

PATENT NO. : 5,578,954
DATED : November 26, 1996
INVENTOR(S) : A. Karl Rapp

It is certified that error appears in the above-indentified patent and that said Letters Patent is hereby corrected as shown below:

In Col. 9, line 57, before "clock signal" insert --first--.

In Col. 11, line 1, before "where" insert --,--.

Signed and Sealed this

Eighteenth Day of March, 1997

Attest:

BRUCE LEHMAN

Attesting Officer

Commissioner of Patents and Trademarks